(12) United States Patent
Zou et al.

(10) Patent No.: US 10,658,264 B2
(45) Date of Patent: May 19, 2020

(54) DIAMOND-BASED HEAT SPREADING SUBSTRATES FOR INTEGRATED CIRCUIT DIES

(71) Applicant: ANALOG DEVICES, INC., Norwood, MA (US)

(72) Inventors: Jin Zou, Lexington, MA (US); Gary T. Wenger, Harvard, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/857,324

(22) Filed: Dec. 28, 2017

(65) Prior Publication Data

US 2019/0074235 A1    Mar. 7, 2019

Related U.S. Application Data

(60) Provisional application No. 62/553,650, filed on Sep. 1, 2017.

(51) Int. Cl.
*H01L 23/373*     (2006.01)
*H01L 23/538*     (2006.01)
*H01L 23/367*     (2006.01)

(52) U.S. Cl.
CPC ........ *H01L 23/3732* (2013.01); *H01L 23/367* (2013.01); *H01L 23/3677* (2013.01); *H01L 23/5384* (2013.01)

(58) Field of Classification Search
CPC ............... H01L 23/3732; H01L 23/367; H01L 23/3675; H01L 21/8252; H01L 23/373
See application file for complete search history.

(56) References Cited

U.S. PATENT DOCUMENTS 5,371,407 A * 12/1994 Goldman ............ H01L 21/4803
257/675
2004/0046248 A1    3/2004 Waelti et al.
(Continued)

FOREIGN PATENT DOCUMENTS

CN          201726633 U    1/2011
EP          1 432 029 A2   6/2004
(Continued)

OTHER PUBLICATIONS

Chao, et al., "a New High Power GaN-on-Diamond HEMT with Low-Temperature Bonded Substrate Technology," dated May 13-16, 2013, pp. 1-4, published by CS MANTECH Conference, New Orleans, LA.
(Continued)

*Primary Examiner* — Thanh Y. Tran
(74) *Attorney, Agent, or Firm* — Knobbe, Martens, Olson & Bear LLP

(57) ABSTRACT

The disclosed technology generally relates to integrated circuit (IC) packages, and more particularly to integrated circuit packages comprising perforated diamond-based heat spreading substrates. In one aspect, a heat spreading substrate for an IC die is configured to be attached to an IC die and to spread heat away therefrom. The diamond-based heat spreading substrate can have an electrically conductive surface and an array of vias formed therethrough. At least one of the vias is configured to overlap an edge of the IC die when attached to the diamond-based heat spreading substrate.

19 Claims, 10 Drawing Sheets

(56) References Cited

U.S. PATENT DOCUMENTS

| | | | |
|---|---|---|---|
| 2004/0056272 A1* | 3/2004 | Searls | H01L 21/0405 257/177 |
| 2004/0263393 A1* | 12/2004 | Lynch | H01Q 9/0457 343/700 MS |
| 2007/0176291 A1 | 8/2007 | Cheah et al. | |
| 2010/0140790 A1 | 6/2010 | Setiadi et al. | |
| 2011/0062579 A1* | 3/2011 | Mishra | H01L 21/8252 257/712 |
| 2014/0110722 A1* | 4/2014 | Kub | H01L 29/66462 257/77 |
| 2015/0056763 A1* | 2/2015 | Hobart | H01L 21/02115 438/172 |
| 2016/0260687 A1* | 9/2016 | Gao | H01L 23/3675 |

FOREIGN PATENT DOCUMENTS

| | | |
|---|---|---|
| TW | 201712816 A | 4/2017 |
| WO | WO 2009/128354 A1 | 10/2009 |

OTHER PUBLICATIONS

Cree Confidential and Proprietary, "Cree, Inc. GaN HEMT G28V4 Process Qualification Report for 28 V Applications," pp. 1-9.

Electronics Cooling, "Integrating a Superior Thermal Material," CVD Diamond, dated Sep. 2014, pp. 1-36, published by ITEM Media, Plymouth Meeting, PA.

Kidalov, et al., "Thermal Conductivity of Diamond Composites," Open Access Materials, dated Dec. 21, 2009, pp. 1-29, published by Ioffe Physical-Technical Institute of the Russian Academy of Science, Saint-Petersburg, Russia (available at: www.mdpi.com/journal/materials).

Lade, et al., "193-nm laser ablation of CVD diamond and graphite in vacuum: Plume analysis and film properties," Applied Physics A. Dec. 1999, dated Jul. 6, 2017, pp. 1-6, published by ResearchGate (available at www.researchgate.net/publication/225334567).

Loutfy, et al., "Advanced Diamond based Metal Matrix Composites for Thermal Management of RF Devices," 5 pages.

Microwave Journal, "Aluminum Diamond Heat Spreader Material for GaN Devices," Microwave Journal, dated Jun. 20, 2017, pp. 1-9, published by Microwave Journal, Norwood, MA.

Microwave Journal, dated Jul. 7, 2017, pp. 1-12, published by Microwave Journal, Norwood, MA (available at www.microwavejournal.com).

Pengelly, et al., "A Review of GaN on SiC High Electron-Mobility Power Transistors and MMICs," dated Jun. 2012, pp. 1-20, vol. 60, No. 6.

Radhakrishna, et al., "Design of RF GaN HEMT Power Amplifier Using MIT Virtual Source GaNFET-RF Model," dated 2014, pp. 1-2.

Yole Development, "Applications, players, devices & substrates 2010-2020," GaN RF Market: From defense to mainstream applications . . . , dated 2014, pp. 1-208.

Zhang, et al., "Electrothermal Simulation and Thermal Performance Study of GaN Vertical and Lateral Power Transistors," IEEE Transactions on Electron Devices, dated Jul. 2013, pp. 1-7, vol. 60, No. 7.

Zimmer, et al., "Challenges in Matching Die to Package CTE's for High Thermal Flux Devices," pp. 1-3, published by sp3 Diamond Technologies, Santa Clara, CA.

Office Action dated Jun. 3, 2019 in Taiwan Patent Application No. 107129935; 19 pages.

* cited by examiner

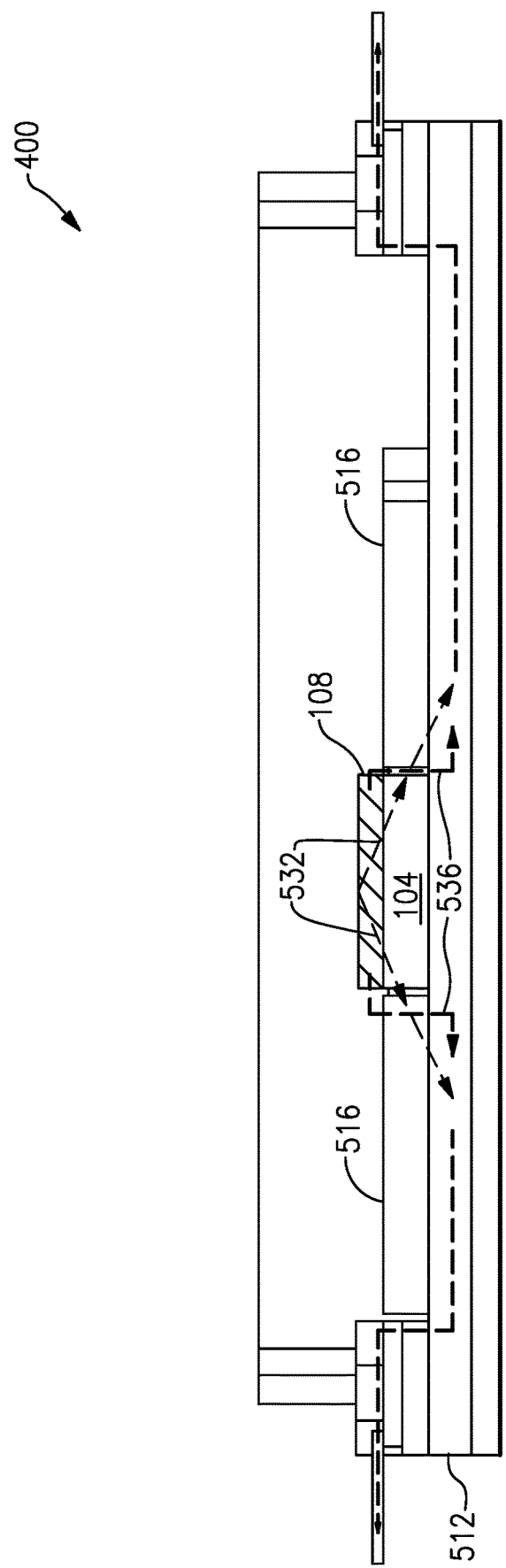

DIAMOND-BASED HEAT SPREADING SUBSTRATES FOR INTEGRATED CIRCUIT DIES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

FIELD OF DISCLOSURE

The disclosed technology generally relates to integrated circuits and integrated circuit devices, and more particularly to integrated circuits and integrated circuit devices comprising diamond-based substrates.

BACKGROUND

As power and circuit density increase in active and passive semiconductor integrated circuit (IC) devices, thermal management of the IC devices during operation increasingly poses a challenge. With insufficient heat management, compromises in performance of the IC devices due to higher device temperatures, and even permanent structural damage can occur. For example, mismatches in coefficients of thermal expansion between the IC dies and certain integrating structures for packaging, e.g., heat spreaders, in thermal communication therewith can cause permanent structural failures, e.g., cracks in the bonding layer (solder or brazing filler metal) between the IC dies and a base plate or a heat sink, or in extreme cases, cracks in the IC dies themselves. For some high power IC devices, such as radio frequency (RF) power transistors and other high power microwave devices, which can include compound semiconductors such as wide band gap (WBG) semiconductors, efficient heat management can pose an especially difficult challenge. This can be because, in addition to higher levels of heat generated by the IC devices, certain integrating structures for packaging the high power IC devices, such as heat spreaders, should also serve to provide RF and DC grounding.

SUMMARY OF THE DISCLOSURE

In an aspect, a packaged integrated circuit (IC) device comprises a heat sink and a diamond-based heat spreading substrate formed on the heat sink, where the diamond-based heat spreading substrate has an array of vias therethrough. The packaged IC device additionally comprises an integrated circuit (IC) die positioned on the diamond-based heat spreading substrate, where an edge of the IC die overlaps at least one of the vias.

In another aspect, a method of assembling an integrated circuit (IC) die comprises providing a diamond-based heat spreading substrate having an electrically conductive surface and an array of vias therethrough. The method additionally comprises attaching an IC die to the diamond-based heat spreading substrate to spread heat away therefrom, wherein attaching comprises positioning at least one of the vias to overlap an edge of the IC die.

In another aspect, a packaged integrated circuit (IC) device comprises a diamond-based heat spreading substrate having an array of vias formed therethrough. The packaged IC device additionally comprises a monolithic microwave integrated circuit (MMIC) die on the diamond-based heat spreading substrate, the MMIC die configured to output a peak power density exceeding about 3 W/mm, wherein an edge of the MMIC die overlaps at least one of the vias, and wherein the diamond-based heat spreading substrate is configured to spread heat generated by the MMIC die away from the MMIC die.

BRIEF DESCRIPTION OF THE DRAWINGS

FIG. 4B illustrates a cross-sectional view of the packaged IC device of FIG. 4A.

DETAILED DESCRIPTION

Figure 1:
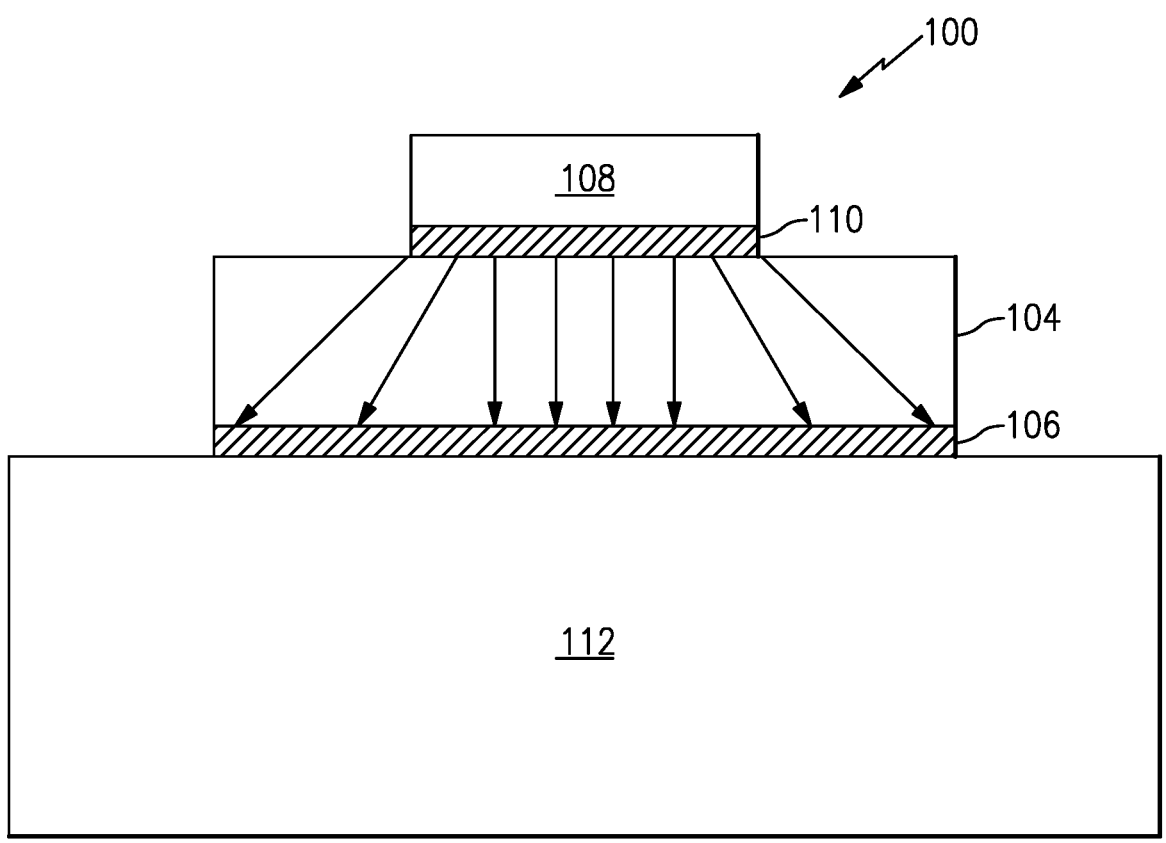
FIG. 1 illustrates a packaged IC device including a heat spreading substrate having attached thereto an IC device on one side and a heat sink on the other side, according to embodiments.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As power and circuit density increase in active and passive semiconductor integrated circuit (IC) devices, including silicon and compound semiconductor IC devices, thermal management during their operation increasingly poses a challenge. In part due to certain advantageous properties over silicon, compound semiconductors are becoming increasingly popular for various applications. For example, some compound semiconductors, e.g., wide band gap (WBG) semiconductors, offer advantageous properties over silicon in various aspects, including higher breakdown voltages, higher thermal conductivity, higher temperature operability and low switching losses, among other advantages. For these and other reasons, various WBG semiconductors have been in commercial use or have been proposed for commercial use in monolithic microwave integrated circuit (MMIC) devices. In particular, the desire for high power in the very high frequency (VHF), ultra high frequency (UHF), and microwave bands has driven the desire for MMIC devices that can supply tens to hundreds of watts at RF frequencies to 10 GHz and beyond. These devices can be made with WBG semiconductors, including GaAs, 6H-SiC, 4H SiC, GaN, and diamond, among others. In particular, because of various advantageous material properties of GaN including wide band gap and high breakdown voltage for high-voltage, high-frequency, and/or high power applications, high power microwave devices are increasingly utilizing gallium nitride (GaN)-based power transistors.

Despite the advantageous properties of WBG semiconductors for high power or microwave applications, effective thermal management for effective commercial implementation can pose a challenge at various levels of integration. For example, WBG semiconductor-based power transistors sometimes suffer from significant self-heating effects, which can limit the achievable power density and/or efficiency. In addition to performance degradation from, e.g., mobility degradation, the high channel temperature induced by the self-heating can accelerate device failure rates and may even lead to destructive burnout. Thermal management approaches to address these challenges include die-level and package-level solutions. In addition to thermal management, package-level solutions for high-voltage, high-frequency, and high power application should also provide effective grounding in both direct current (DC) and RF, as well as mechanical integrity. Thus, there is a need for a thermal management solution for IC devices for high-voltage, high-frequency, and high power applications that address these competing challenges.

To mitigate various problems, various embodiments of a packaged IC device disclosed herein include a heat spreading substrate or a heat spreader. Referring to FIG. 1, a packaged IC device 100 includes a heat spreader 104, which is a heat spreading base plate attached to the base of an IC die 108 on one side by a die attach layer 110. The heat spreader 104 is attached on the other side to a heat sink 112 by a carrier attach layer 106. The heat spreader 104 is configured to spread the heat (indicated by arrows) generated by the IC die 108, which has a smaller area than the heat spreader 104, to the heat sink 112, which has an area that is larger than the heat spreader 104. To serve as an efficient heat spreader, different aspects of the heat spreader can be enhanced and/or optimized according to embodiments disclosed herein, including thermal conductivity (TC), coefficient of thermal expansion (CTE), and bonding characteristics between the chip components and the bonding layer. In the following, various embodiments of a heat spreader 104 comprising diamond are described, which address these and other objectives.

Figure 2A:
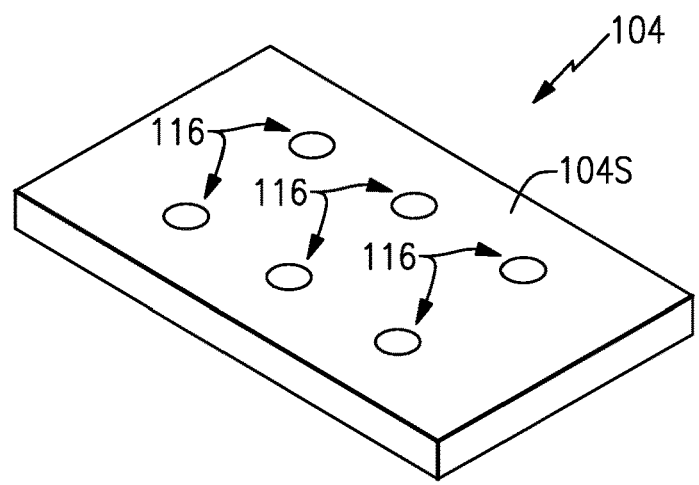
FIG. 2A illustrates a perspective view of a diamond-based heat spreading substrate having formed therethrough an array of vias, according to embodiments.
Figure 2B:
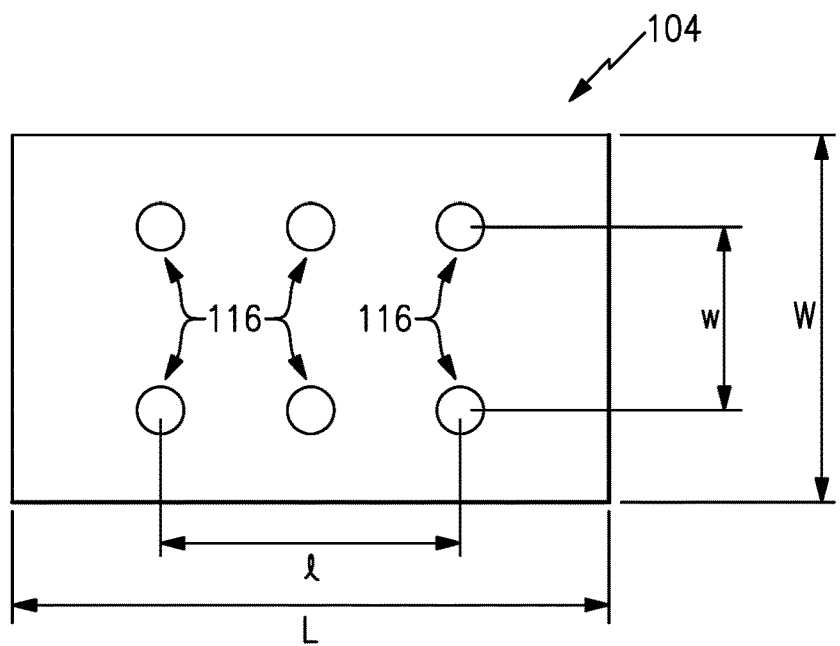
FIG. 2B illustrates a plan view of the heat spreading substrate illustrated in FIG. 2A.
Figure 2C:
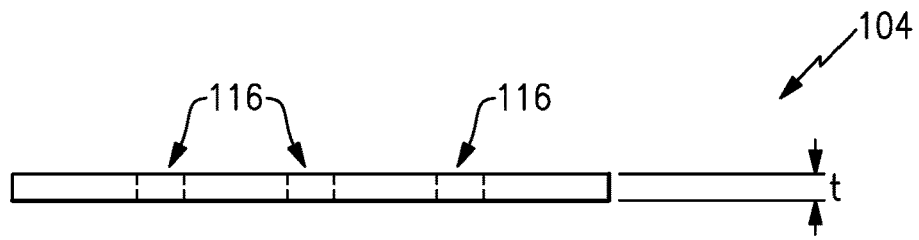
FIG. 2C illustrates a cross-sectional side view of the heat spreading substrate illustrated in FIGS. 2A and 2B.

To address the various needs described above including thermal management needs and the grounding needs of high power microwave devices, various embodiments described herein include a heat spreader comprising diamond that is configured to be attached to an integrated circuit (IC) device. FIGS. 2A-2C illustrate a perspective view, a plan view and a cross sectional view of the heat spreader 104, respectively, in detail. The heat spreader 104 comprises diamond and is configured to be attached to the IC die 108, as illustrated in FIG. 1, and has formed therethrough an array of vias 116, or perforations. In various embodiments, the perforations are configured to overlap edges of the IC die 108 when attached thereto, and has outer surfaces 104S coated with a conductive layer, as described in detail with respect to FIG. 3. According to embodiments, the outer surface 104S coated with the conductive layer may include one or more of a top surface, a bottom surface and side surfaces, as well as inner surfaces of one or more of the array of vias 116.

In the illustrated embodiment, the array of vias 116 includes an even number of vias 116 that form a plurality of rows of vias 116 arranged along lines extending in a lengthwise direction and spanning a distance 1, for example, as shown in FIG. 2B. The array of vias 116 also form a plurality of columns of vias 116 arranged along lines extending in a widthwise direction spanning a distance w. The positions of the vias 116 are arranged such that one or both of the outermost rows and/or one or both of the outermost columns of the vias 116 overlap at one or more edges of an IC die (108 in FIG. 1). In some embodiments, at least the outermost rows of the vias 116 are arranged symmetrically about an axis, which extends between the outermost rows of the vias 116 and in a lengthwise direction, which axis is equidistant from each of the outermost rows of the vias 116. Alternatively or additionally, at least the outermost columns of the vias 116 are symmetric about an axis, which extends between the outermost columns of the vias 116 and in a widthwise direction, that is equidistant from each of the outermost columns of the vias 116. Because of the symmetry, for each one of the vias 116 in a column or a row, there is a corresponding one of the vias 116 in a symmetrically arranged column or row. Thus, symmetrically corresponding rows and/or columns of the vias 116 can have the same number of vias, where the vias have substantially the same dimensions such that, when an IC die 108 is attached to the heat spreader 104, the stress exerted by the heat spreader 104 on the IC die 108 is symmetrically reduced. For example, when the IC die 108 is attached to the heat spreader 104 with opposing edges overlapping symmetrically corresponding pairs of rows or columns of the vias 116, the resulting reduction in stiffness of the heat spreader 104 and in stress between the IC die 108 and the heat spreader 104 at the first and second edges is symmetric about the axes of symmetry as described above.

In the illustrated embodiment, the vias 116 are arranged in two rows each having three vias 116 and three columns each having two vias. However, embodiments are not so limited and the vias 116 can be arranged in any suitable number of rows and any number of columns, e.g., between 2 and 10, where each of the rows and columns can have any suitable number of vias 116, e.g. between 2 and 10, according to embodiments.

According to various embodiments, the bulk of the heat spreader 104 is formed of a material comprising diamond.

Diamond offers various advantageous for thermal management of IC devices, owing in part to its desirable thermal conductivity. In contrast to metals, where conduction electrons are responsible for the high thermal conductivity, heat is conducted in electrical insulators by lattice vibrations. With a sound velocity of about 17,500 meters per second (m/s), diamond has a very high Debye temperature (2220 Kelvins (K)), exceeding that of most other insulating materials by an order of magnitude and leading to the very high thermal conductivity at room temperature (2000-2500 Watts per meter Kelvin (W/m K)), which exceeds that of copper by a factor of five.

Despite its desirable thermal properties, diamond can be a relatively poor electrical conductor, such that bulk diamond by itself may be unsuitable when used as a heat spreader of an IC device that is also configured to provide electrical conduction, e.g., as part of DC and/or RF grounding path. In addition, diamond also has one of the highest stiffness values, and when attached to an IC die, a mismatch in coefficient of thermal expansion (CTE) may cause stress on the IC die and/or the bonded interface between the IC die and the diamond-based substrate. Thus, various embodiments described herein advantageously combine material and physical designs to provide a heat spreader for IC dies, such as MMIC dies, with superior heat dissipation and electrical grounding capabilities, as well as superior mechanical compatibility with the IC dies.

While single crystalline diamond can be prohibitively expensive, polycrystalline synthetic diamond can be used to reduce the cost for the heat spreader 104. While lower than single crystal diamond, polycrystalline diamond can still have the highest thermal conductivity of any non-diamond material. Thus, according to some embodiments, the heat spreader 104 comprises polycrystalline synthetic diamond. Such polycrystalline diamond can be formed by chemical vapor deposition (CVD). The polycrystalline diamond can be formed, e.g., in a reactant environment having relatively high hydrogen to carbon ratios, e.g., about 0.1 to 10% methane ($CH_4$) in hydrogen ($H_2$), e.g., 1% $CH_4$ in $H_2$, at temperatures between, e.g., 700° C. and 1000° C. and a gas pressures in the range of 30-300 Torr. The deposition technique can include, e.g., plasma-assisted CVD and thermally assisted CVD using a hot wire or a filament. According to various embodiments, by controlling the reaction conditions, the thermal conductivity of the heat spreader 104 is controlled to have a value greater than 1000 W/mK, greater than 1200 W/mK, greater than 1400 W/mK, greater than 1600 W/mK, greater than 1800 W/mK, greater than 2000 W/mK or a value within a range defined by any of these values, e.g., 1200 to 2000 W/mK.

To provide electrical conduction between the IC die 108 and the heat sink 112, e.g., to provide electrical grounding, in various embodiments, the outer surfaces 104S of the heat spreader 104 are coated with one or more conductive layers, e.g., a metallic layer. According to embodiments, the coated outer surfaces 104S include surfaces of the vias 116. In one embodiment, the conductive metal layer includes a Ti/Pt/Au stack, where each of the Ti and Pt layers has a thickness of about 50 nm, 100 nm, 200 nm, 300 nm or a thickness in a range defined by any of these values, and Au has a thickness of about 500 nm, 1000 nm, 1500 nm, 2000 nm, 2500 nm, 3000 nm, or a thickness in a range defined by any of these values. Advantageously, the Ti/Pt/Au stack can be compatible with attaching the heat spreader 104 to the IC die 108 using a die attach layer (110 in FIG. 1), e.g., Au/Ge eutectic, Au/Si eutectic or Au/Sn solders, among others. In addition, the Ti/Pt/Au can withstand subsequent process temperatures exceeding 450° C. However, embodiments are not so limited and in other embodiments, the coated outer surfaces 104S can be coated with any of stacks such as TiW/Au, TiW/Ni/Au, TiW/Cu/Ni/Au, TiW/Au/Cu/Ni/Au, Ti/Au, TaN/TiW/Au and TaN/Ti/Ni/Au, to name a few, depending on the desired thermal and electrical performance.

In some other embodiments, the bulk of the heat spreader 104 is formed of a composite material comprising diamond, which may have a relatively high thermal conductivity as well as electrical conductivity. In some embodiments, the heat spreader 104 comprises a metal matrix composite (MMC), comprising diamond grains and intergranular matrix comprising a suitable metal, e.g., Al, Ag, or Cu. The MMC materials can produced by infiltrating certain metal or metal alloys (Ag, Al, Cu or their alloys) into a mold containing diamond particles. For example, diamond particles may be filled in a mold and heated in a vacuum furnace to a temperature above the melting temperature of the metal or the alloy. Subsequently, a high pressure may be applied to infiltrate the metal into the mold including the diamond particles to form a composite material having the metal as the matrix. In some embodiments, the substrate comprises a metal matrix diamond composite material comprising diamond particles in a metal matrix. In some embodiments, the metal of the metal matrix comprises or is aluminum.

By forming the bulk of the heat spreader 104 using an MMC having a diamond volume fraction exceeding about 30%, 50% or 70% or in a range defined by any of these percentages, the effective thermal conductivity of the heat spreader 104 can be controlled to have a value higher than 200 W/mK, higher than 400 W/mK, higher than 600 W/mK, higher than 800 W/mK, higher than 1000 W/mK, or to have a value in a range defined by any of these values, according embodiments. Advantageously, by selecting, among other things, the metal of the MMC and the volume fraction of diamond, the thermal conductivity can be controlled to be higher than, e.g., CuW (about 200 W/mK), CuMo (about 250 W/mK) and Cu/Mo/Cu (350 W/mK). Advantageously, when formed of an MMC comprising diamond, the surface of the of the heat spreader 104 can be formed of the metal of the MMC while the bulk is formed of the MMC. That is, the heat spreader 104 can comprise a bulk MMC covered with a "skin" formed of the metal of the MMC, thereby providing the electrical conductivity. However, embodiments are not so limited, and in other embodiments, the heat spreader 104 formed of the MMC can be further coated with a conductive metal layer or stack, e.g., a Ti/Pt/Au stack among various other metal stacks, as described above.

Still referring to FIGS. 2A-2C, the heat spreader 104 can have various physical dimensions that are arranged based on a variety of factors, including electrical, thermal and mechanical considerations. The variety of factors can depend on the IC die to be attached thereto, heat generated by the IC die, operational temperature, CTE mismatch and the desired stiffness, among other considerations.

In various embodiments described herein, the heat spreader 104 can have a thickness (t in FIG. 2C) of about 0.10", 0.05", 0.02", 0.01", 0.005", 0.002", 0.001", or any value in a range defined by any of these values.

In various embodiments described herein, the heat spreader 104 can have a length (L in FIG. 2B) of about 0.05" 0.10", 0.20", 0.50", or any value in a range defined by any of these values, for instance about 0.27".

In various embodiments described herein, the heat spreader 104 can have a width (W in FIG. 2B) of about 0.05" 0.10", 0.20", 0.50", or any value in a range defined by any of these values, for instance about 0.16".

In various embodiments described herein, the distance (l in FIG. 2B) between outermost columns of vias 116 can be about 0.05" 0.10", 0.20", 0.50" or any value in a range defined by any of these values, for instance about 0.13".

In various embodiments described herein, the distance (w in FIG. 2B) between outermost columns of vias 116 can be about 0.05" 0.10", 0.20", 0.50" or any value in a range defined by any of these values, for instance about 0.08".

In various embodiments described herein, the diameter of the vias 116 can be about 0.10", 0.05", 0.02", 0.01", 0.005", 0.002", 0.001", or any value in a range defined by any of these values.

In some embodiments, the illustrated vias 116 are hollow. However, embodiments are not so limited and in other embodiments, the vias 116 can be filled or partially filled with a suitable material to provide further control over mechanical and thermal properties. For example, the vias 116 can be filled or partially filled with any of the conductive layers described above with respect to the coated outer surfaces 104S.

Figure 3A:
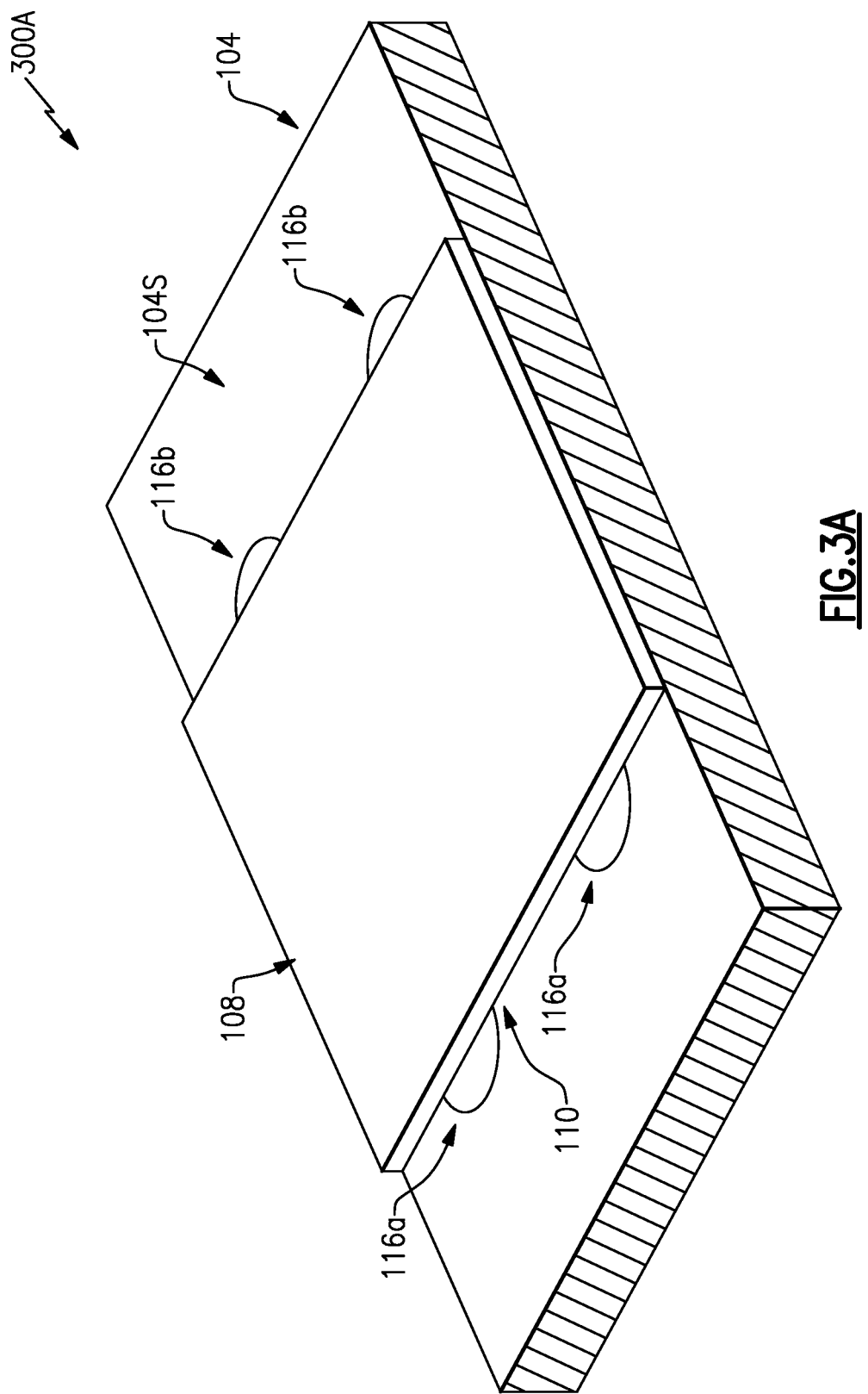
FIG. 3A illustrates a perspective view of a packaged IC device including a heat spreading substrate similar to that illustrated in FIGS. 2A-2C, and an IC die attached thereto, according to embodiments.
Figure 3B:
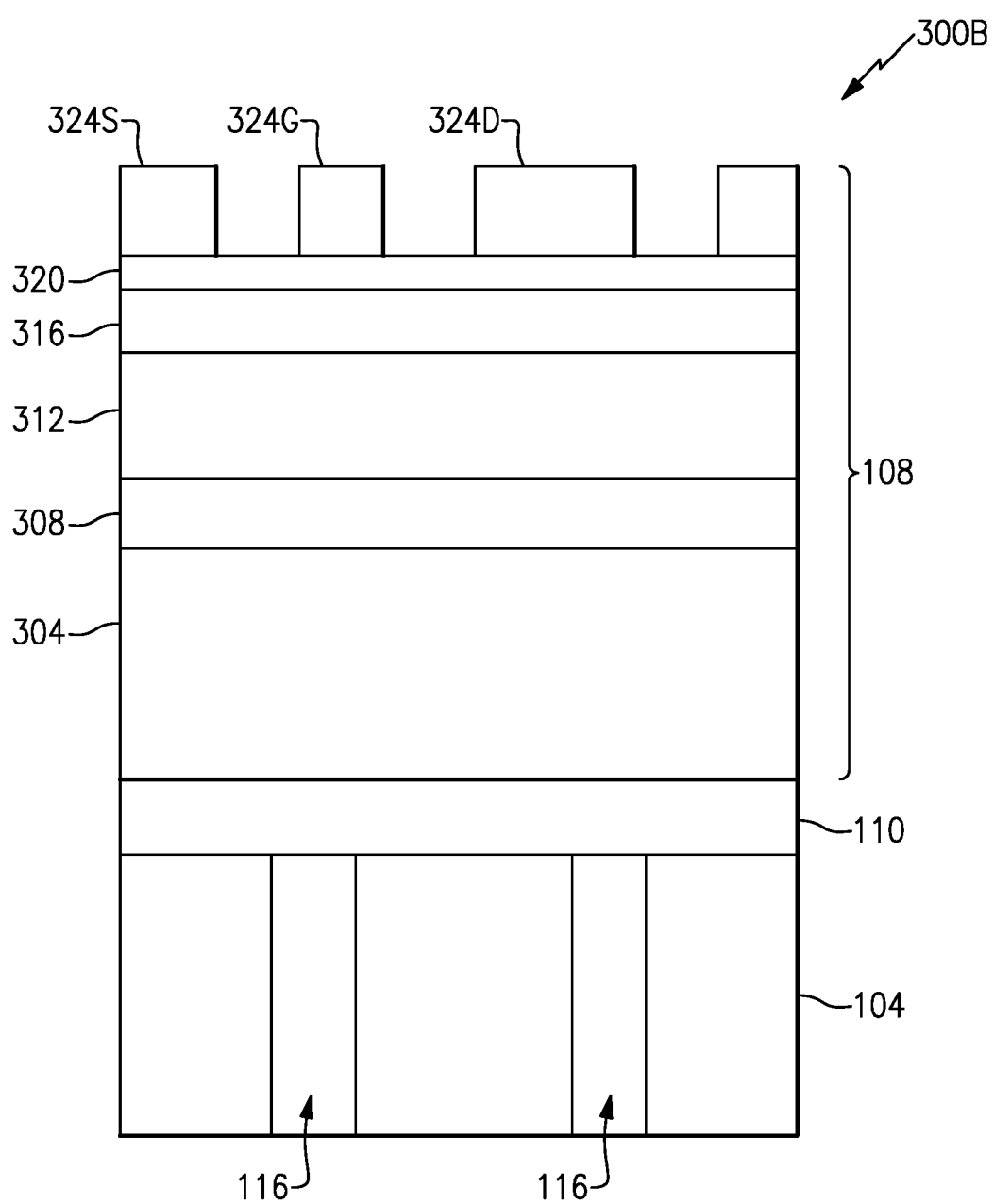
FIG. 3B illustrates a cross-sectional view of a packaged IC device including a heat spreading similar to that illustrated in FIGS. 2A-2C, and a monolithic microwave IC (MMIC) die attached thereto, according to embodiments.

FIGS. 3A and 3B illustrate a perspective view and a cross sectional view of a packaged IC device 300A and 300B, respectively, including a heat spreader 104 and an IC die 108, e.g., an MMIC die, attached thereto, according to embodiments. While not illustrated in FIGS. 3A and 3B, the IC die 108 and the heat spreader 104 can be attached through a die attach layer (110 in FIG. 1), e.g., Au/Ge eutectic, Au/Si eutectic or an Au/Sn solder. The packaged IC device 300A/300B includes a heat spreader 104 comprising diamond, which can be similar to the heat spreader 104 described above with respect to FIGS. 2A-2C. The heat spreader 104 has attached thereto on one side an integrated circuit (IC) die 108. While not shown in FIGS. 3A and 3B, the integrated IC device 300A/300B may additionally include a heat sink (112 in FIG. 1) attached on the other side of the heat spreader 104, similar to that illustrated in FIG. 1. Similar to as described above with respect to FIGS. 2A-2C, the bulk of the heat spreader 104 may be diamond-based, e.g., formed of polycrystalline diamond or an MMC comprising diamond, and the surface of the heat spreader 104 may comprise a conductive layer.

Referring to the packaged device 300A of FIG. 3A, according to embodiments, the array of vias 116a, 116b have the number, dimensions and positions such that they reduce the stiffness of the heat spreader 104 to reduce the stress between the IC die 108 and the heat spreader 104. In addition, the vias 116a, 116b can provide a direct grounding path, e.g., DC grounding path, for the IC die 108.

When the heat spreader 104 is configured according to an embodiment illustrated in FIGS. 2A-2C, the vias 116a and 116b of FIG. 3A represent those of the outer columns of vias 116 separated by the distance 1 in FIG. 2B, while a middle column of vias 116, when present, may be hidden from view (i.e., covered by the IC die 108). However, embodiments are not so limited, and the middle column of vias can be omitted from the heat spreader 104 of FIG. 3A.

As described above with respect to FIGS. 2A-2C, vias 116a, 116b are positioned at locations corresponding to edges of the IC die 108 to be attached thereto. In the illustrated embodiment of FIG. 3A, the vias 116a, 116b are positioned such that portions of the cross-sectional areas of each of the vias 116a, 116b are covered by the IC die 108, while remaining portions remain uncovered. For example, in the illustrated embodiment, the vias 116a, 116b cover about half of the cross-sectional areas of each of the vias 116a, 116b, while the remaining half of the cross-sectional areas of the vias 116a, 116b remains uncovered. However, embodiments are not so limited, and in other embodiments, the vias 116a, 116b cover any suitable fractional cross-sectional areas of each of the vias 116a, 116b, e.g., 5%, 20%, 40%, 60%, 80%, 95% or a fraction in a range defined by any of these values.

Still referring to FIG. 3A, the array of vias 116a, 116b include an even number of vias, including a row of first vias 116a that are positioned to overlap a first edge of the IC die 108, and a row of second vias 116b that are positioned to overlap a second edge of the IC die 108, wherein the first edge and the second edge of the IC die 108 laterally oppose each other. In the illustrated embodiment, the row of the first vias 116a and the row of the second vias 116b are symmetric about an axis that is between and equidistant from each of the first and second edges of the IC die 108, or between and equidistant from each of the row of the first vias 116a and the row of the second vias 116b. That is, for each one of the first vias 116a, there is a corresponding one of the second vias 116b that is symmetrically positioned. In the illustrated embodiment, the row of the first vias 116a and the row of the second vias 116b have the same number of vias. In addition, the corresponding ones of the first and second vias 116a and 116b, respectively, have substantially the same dimensions and are symmetrically positioned to overlap the IC die 108 at the first and second edges that laterally oppose one another, such that the resulting reduction in stiffness of the heat spreader 104, and/or the reduction in stress between the IC die 108 and the heat spreader 104 at the first and second edges, are symmetric about the equidistant axis between first and second edge of the IC die 108. The inventors have found that the symmetry of the vias 116a and 116b can suppress warpage of the heat spreader 104.

In the illustrated embodiment, the rows of the vias 116a, 116b are positioned to overlap one of the pairs of opposing edges of the IC die 108, while the other of the pairs of opposing edges of the IC die 108 do not overlap with the vias 116a, 116b. Instead, the other of the pairs of opposing edges of the IC die 108 is aligned with corresponding edges of the heat spreader 104. However, embodiments are not so limited and in other embodiments, the other of the pairs of opposing edges of the IC die 108 can also overlap rows of vias.

The vias can be formed using a suitable process, including laser and/or water jet processes.

Among other functionalities, the vias 116, 116b address various aspects of thermal management issues encountered in integrating IC dies, e.g., IC dies comprising devices formed using WBG semiconductors, as described above. For a given coefficient of thermal expansion (CTE) mismatch between the IC die 108 and the heat spreader 104, the various thermal management issues can be associated with an effective stiffness of a heat spreader 108. When the stiffness of the heat spreader 104 is lower, the heat spreader 108 can conform to the stress induced by the CTE mismatch, thereby reducing the overall stress induced on the IC die 108. The effective stiffness in turn depends on the thickness of the heat spreader 104. While reducing the thickness of the heat spreader 104 can lead to a reduction in stiffness, when the thickness of the heat spreader 104 is made too thin, at elevated temperatures under operating conditions, the CTE mismatch between the IC die 108 and the heat spreader 104 may cause warping or bending of the heat spreader 104, which can in turn cause cracks in various components or delamination at various interfaces thereof. The inventors have found that, the spatial arrangement of the vias 116a, 116b in combination with the various material designs as described herein, can effectively reduce the stiffness of the heat spreader 104.

The various arrangements of the vias 116a, 116b, including their dimensions, can be optimized based on a variety of factors. For example, the number of vias and the diameter of the vias determine the amount of volume that is removed relative to a substrate formed of the same material without the vias. The inventors have found that, by removing a given volume of material in this manner, the stiffness of the substrate can be tailored to achieve a suitable or acceptable mismatch in strain between the substrate and the IC die 108. According to various embodiments, the diameter and the number of vias are such that the volume removed by the vias can exceed about 1%, exceed about 3%, exceed about 5%, exceed about 10%, exceed about 15%, exceed about 20% or have a percentage in a range defined by any two of these values, relative to a substrate without having the vias formed therethrough. Under some configurations, the volume removed by these percentages correspond, in terms of the amount of stiffness reduction to the heat spreader 104, correspond to thickness reductions by about the same amount.

Still referring to referring to FIG. 3A, in some embodiments, the heat spreader 104 has at least a first major surface configured to contact the IC die 108 having a relatively smooth surface, which can be achieved by polishing after depositing the conductive layer as described above by, e.g., chemical vapor deposition. For example, the first major surface of the heat spreader 108 can have a root mean square (RMS) surface roughness less than $5 \times 10^{-3}$", less than $1 \times 10^{-3}$", less than $5 \times 10^{-4}$", less than $1 \times 10^{-4}$", or a value in a range defined by any two of these values. In some embodiments, the second major surface of the heat spreader 104 opposite the first major surface, which may be configured to contact a heat sink, may also be polished to have similarly smooth surface in some embodiments. However, in other embodiments, polishing can be omitted, such that the second major surface has a relatively rough surface, greater than the roughness value of the first major surface, which may be the surface roughness obtained with as-grown conductive layer by chemical vapor deposition.

The IC die 108, e.g., an MMIC die, can include a variety of devices configured to operate in RF frequencies, according to embodiments. By way of example, FIG. 3B illustrates a cross-sectional view of a packaged IC device 300B including a heat spreader 104 arranged similar to that illustrated with respect to FIGS. 2A-2C, and an example of a high power microwave IC die 108 attached thereto, e.g., using a die attach layer 110. FIG. 3B shows a detailed view of the IC device in the IC die 108. The illustrated IC device in the IC die 108 includes a GaN-based power microwave device comprising a high electron mobility transistor (HEMT) device, e.g., an AlGaN/GaN HEMT device, for high power microwave applications.

The illustrated HEMT device in the IC die 108 includes a semiconductor substrate 304, e.g., silicon carbide (SiC) substrate such as semi-insulating 4H SiC substrate, on which a nucleation layer 308, e.g., an AlN nucleation is grown. A GaN layer 312, e.g., an Fe-doped insulating GaN is formed on the nucleation layer 308, followed by an interlayer 316, e.g., an AlN interlayer and a AlGaN cap layer 320, e.g., an undoped AlGaN cap layer. The AlGaN layer 320 has formed thereon a plurality of contacts including a source contact 324S, a gate contact 324G and a drain contact 324D. The GaN layer 312 can be configured to form a 2 dimensional electron gas (2 DEG) therein, and the AlGaN layer 320 may form a Schottky junction with the gate contact 324G.

In some embodiments, the HEMT device may be a depletion-mode HEMT, where the 2D electron gas may be formed in the GaN layer 312 without application of a bias to the gate. Such a transistor is referred to as a "normally on", and will turn off when the gate contact 324B is negatively biased. In other embodiments, by sufficient doping of the AlGaN cap layer 320 with acceptors, the HEMT can be configured as a "normally off" device. The illustrated transistor can operate at frequencies up to about 20 GHz or even up to about 200 GHz.

While the example IC die 108 in the illustrated embodiment includes a GaN-based HEMT device by way of illustration, embodiments are not so limited, and the IC die 108 can various other devices. For example, the IC die 108 can include various other transistors including bipolar junction transistors (BJTs), enhancement-mode metal-oxide-semiconductor field effect transistors (MOSFETs), heterojunction bipolar transistors (HBTs), metal-semiconductor FETs (MESFETs), and laterally diffused MOS (LDMOS), to name a few, which can be formed based on e.g., GaAs or GaN. These transistors take advantage of the material combinations to produce a customized amplifying and power handling capability.

It will be appreciated that some GaN-based MMIC devices may have higher power generation and heat dissipation capabilities in general compared to GaAs-based devices. For example, while some GaAs-based MMIC devices have peak power densities that may be less than 5 W/mm, less than 4 W/mm or even less than 3 W/mm, GaN-based MMIC devices can have peak power densities exceeding about 3 W/mm, exceeding about 4 W/mm, exceeding about 5 W/mm, exceeding about 7 W/mm, exceeding about 9 W/mm, exceeding about 11 W/mm exceeding about 13 W/mm, or a power densities in a range defined by any of these values.

Still referring to FIG. 3B, in a similar manner as described above with respect to FIG. 3A, the IC die 108 is attached to the heat spreader 104 through the die attach layer 110, e.g., a AuSn layer, and positioned with respect to the array of vias such that one or more edges of the IC die 108 overlap one or more vias 116 formed through the heat spreader 104, and such that the heat generated by the IC die 108 is efficiently spread by the heat spreader 104. In addition to the mechanical advantages provided by the vias 116 as described above, the heat spreader 104 also provide DC and RF grounding path for the IC die 108 through the conductive layer formed on surfaces of the heat spreader 104 including, e.g., the inner surfaces of the vias 116.

Figure 4A:
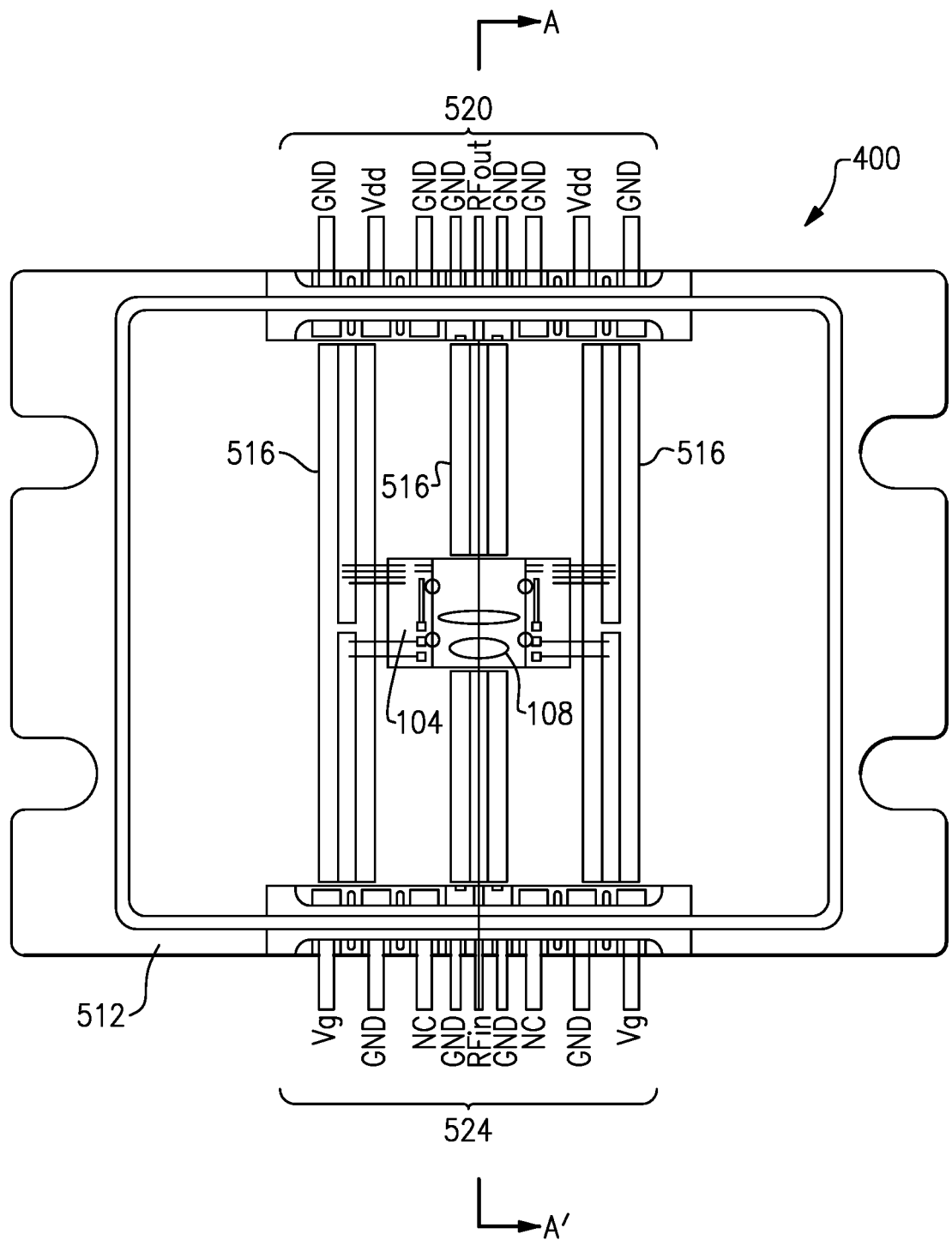
FIG. 4A illustrates plan view a packaged IC device including a heat spreading substrate similar to that illustrated in FIGS. 2A-2C, having an IC die and a heat sink attached thereto, according to embodiments.

FIGS. 4A and 4B illustrate a plan view and a cross-sectional view of a packaged IC device 400, according to some other embodiments. The packaged IC device 400 includes an IC die 108, e.g., an MMIC die, attached to a heat spreader 104, which is in turn attached to a heat sink 512. The illustrated configuration is sometimes referred to as "chip on tab" configuration, and may offer various commercial and/or technological advantages compared to configurations in which the IC die is directly attached to a heat sink. The advantages can include the ability to accommodate relatively large IC dies, superior heat spreading capability and reworkability, to name a few. As described above, the heat spreader 104 includes an array of vias and is coated with a conductive metal layer. The vias are positioned such that they overlap one or more edges of the IC die 108 which, as described above to reduce the stiffness thereof and to provide a DC grounding path. The IC die 108 and the heat spreader 104 are similar to those described above, in which the heat spreader 104 is configured to spread heat generated by the IC die 108, which has a smaller area than the heat spreader 104, before being diffusively conducted into the heat sink 512, which has an area and a thermal mass that is significantly larger than the heat spreader 104. Furthermore, as described above, by optimizing the volume of material removed by the vias and the positions of the vias, the stiffness of the heat spreading substrate can be optimized to serve as a buffer against CTE-related stress that would otherwise be greater in the absence of the heat spreader 104.

Referring to FIG. 4A, the packaged IC device 400 additionally includes a plurality of input pins 524 including Vg, GND, NC and RFin for incoupling DC and RF signals to the IC die 108, and a plurality of output pins 520 pins including Vdd, GND and RFout for outcoupling DC and RF signals from the IC die 108. While pins are illustrated, any suitable contacts and/or pads can be alternatively or additionally implemented. The heat sink 512 has formed thereon a plurality of planar transmission lines 516, e.g., 50 Ohm transmission lines, for coupling RF signals to and from the IC die 108. The IC die 108 and the heat spreader 104 are electrically connected by a plurality wires, e.g., Au wires, and the IC die 108 and the planar transmission lines 516 are electrically connected by a plurality of wires, e.g., Au wires.

FIG. 4B illustrates a cross-sectional view taken, e.g., through line AA' in FIG. 4A. FIG. 4B schematically illustrates heat spreading paths 532 from a heat source, e.g., a semiconductor-semiconductor junction or a semiconductor-metal junction. In addition, FIG. 4B schematically illustrates lateral RF grounding paths 536, whose path includes the outer conductive layer of the heat spreader 104.

Figure 5:
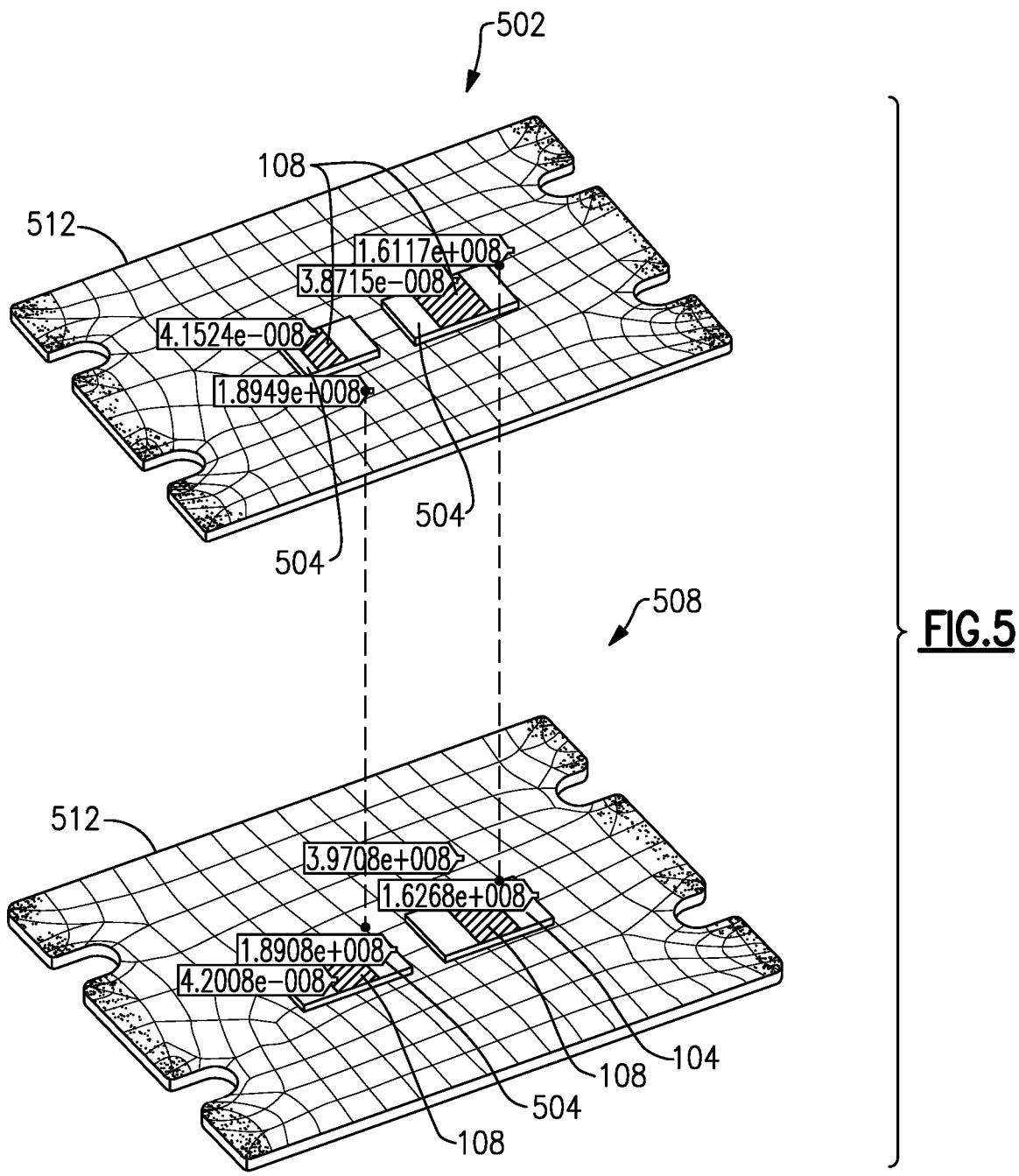
FIG. 5 shows comparisons of experimental three-dimensional stress contour maps between conventional heat spreading substrates and heat spreading substrates according to embodiments.

FIG. 5 shows comparisons of experimental three-dimensional stress contour maps 502, 508 between conventional heat spreaders and heat spreaders according to embodiments. The upper stress contour map 502 shows a common heat sink 512 having attached thereto a conventional heat spreader 504 and a diamond-based heat spreader 104 having a conductive surface and an array of vias formed therethrough, according to embodiments. The heat spreaders 504, 104 have identical IC dies 108 attached thereto. The heat spreaders 504, 104 are attached using the same epoxy, have the same dimensions and are arranged identically except, the heat spreader 504 is formed of a CuW without having vias formed therethrough, while the heat spreader 104 is configured in a similar manner as described above. The stress measured at 150° C. on corresponding edge locations on the heat spreaders 504, 104, where the stresses are locally higher, show stress values of 41.5 megapascal (MPa) and 38.7 MPa, respectively. The lower stress contour map 508 similarly shows a common heat sink 512 having attached thereto a conventional heat spreader 504 and a heat spreader 104 according to embodiments, where the heat spreaders 504, 104 have identical IC dies 108 attached thereto. The components in the lower simulated stress contour map 508 are arranged in the same manner as the corresponding components in the upper simulated stress contour map 502 except, the heat spreaders 504, 104 in the lower stress contour map 508 are attached using a different epoxy than the epoxy used to attach the heat spreaders 504, 104 in the upper stress contour map 502. Similar to the upper contour map 502, the stress measured at 150° C. of corresponding edge locations on the heat spreaders 504, 104, where the stresses are locally higher, show stress values of 42.0 MPa and 39.7 MPa, respectively. The experimental stress contour maps 502, 508 show that, by employing the heat spreader 104 according to embodiments, the stress can be significantly lowered.

Figure 6:
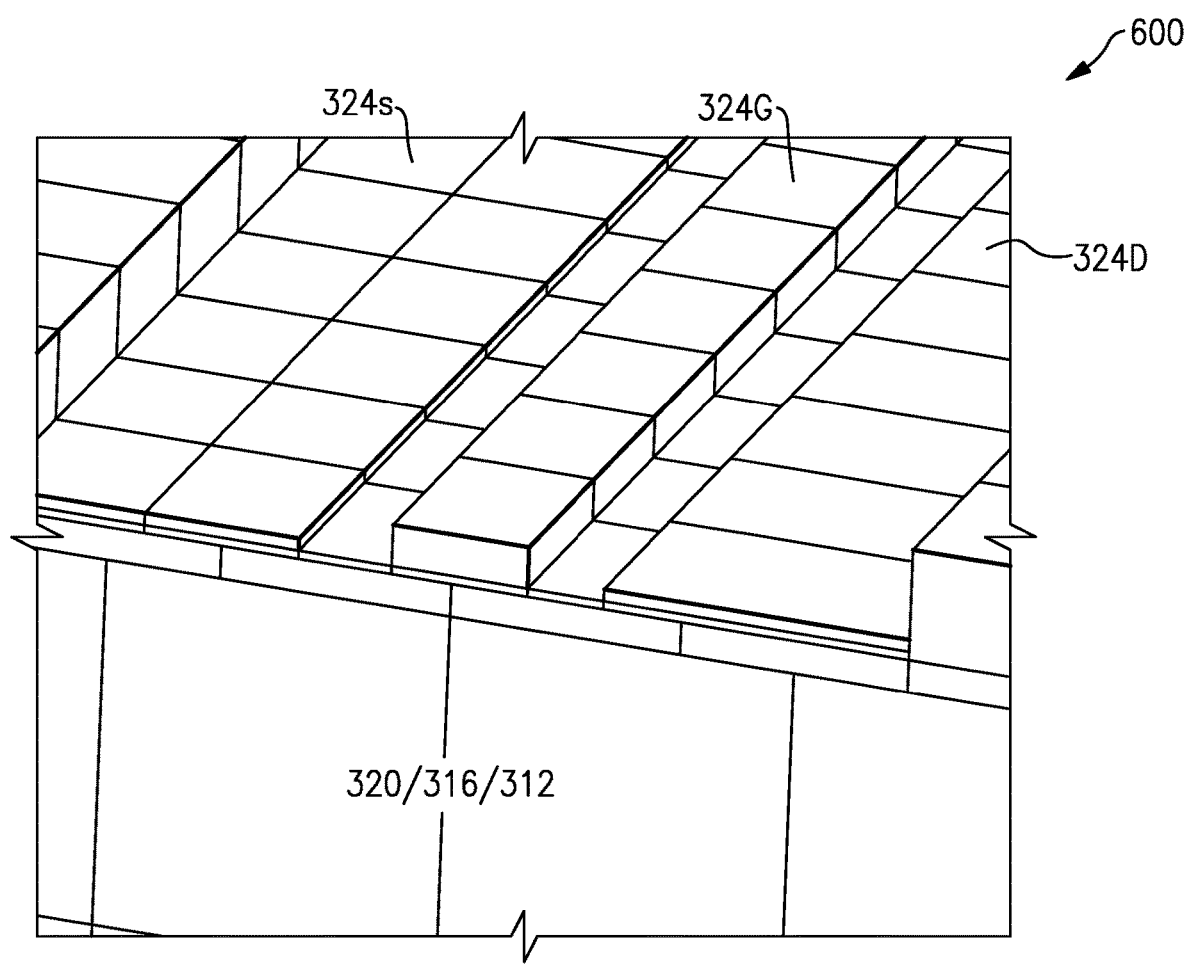
FIG. 6 illustrates a device structure in an MMIC die used to obtain comparative thermal and electrical results.
Figure 7:
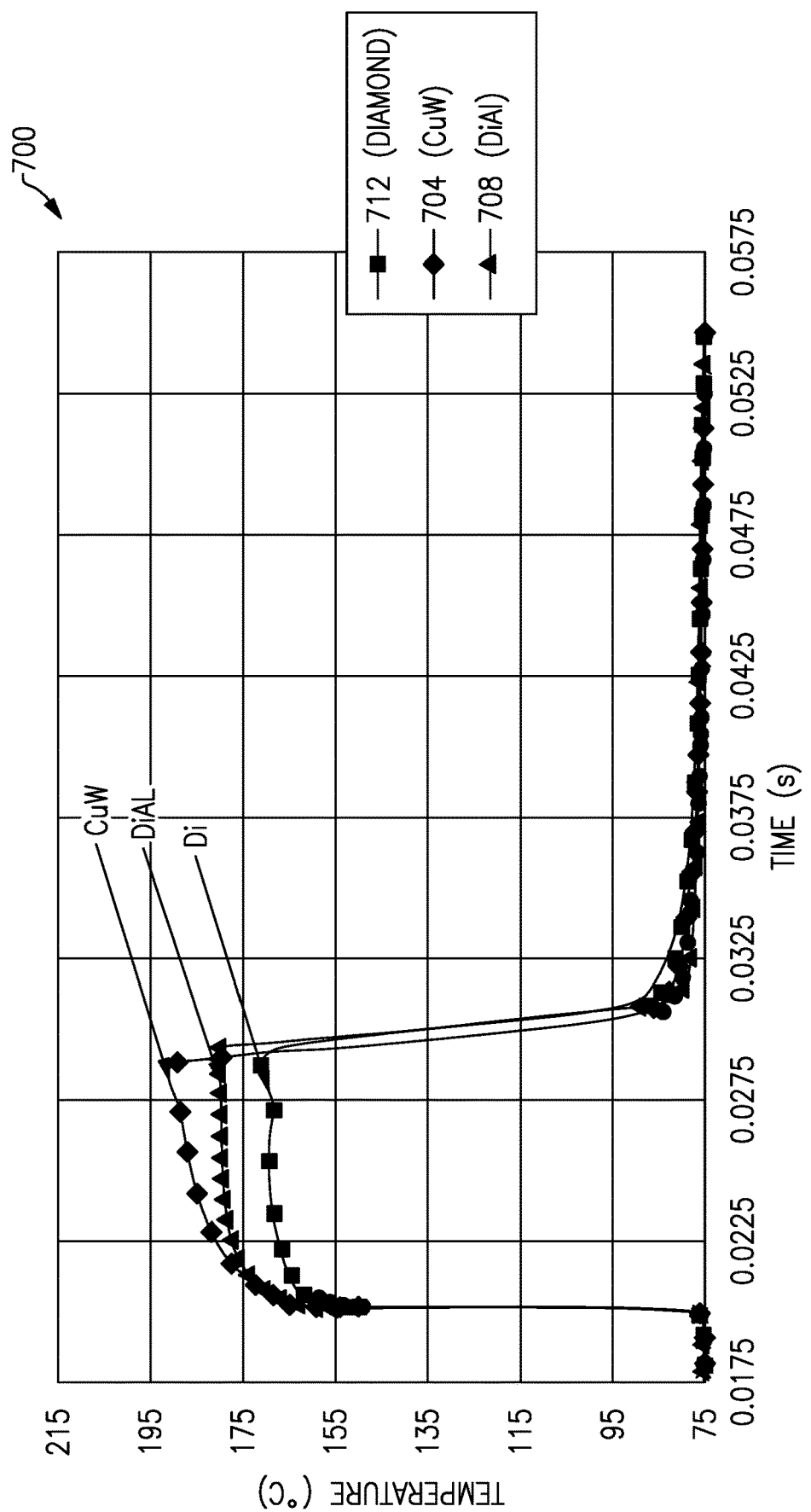
FIG. 7 shows a graph of experimental temperature traces of a channel of a high electron mobility transistor (HEMT) device under a pulsed power condition, taken on device structures similar to the device structure of FIG. 6, in which the MMIC dies having the HEMT device are attached to different heat spreading substrates.
Figure 8:
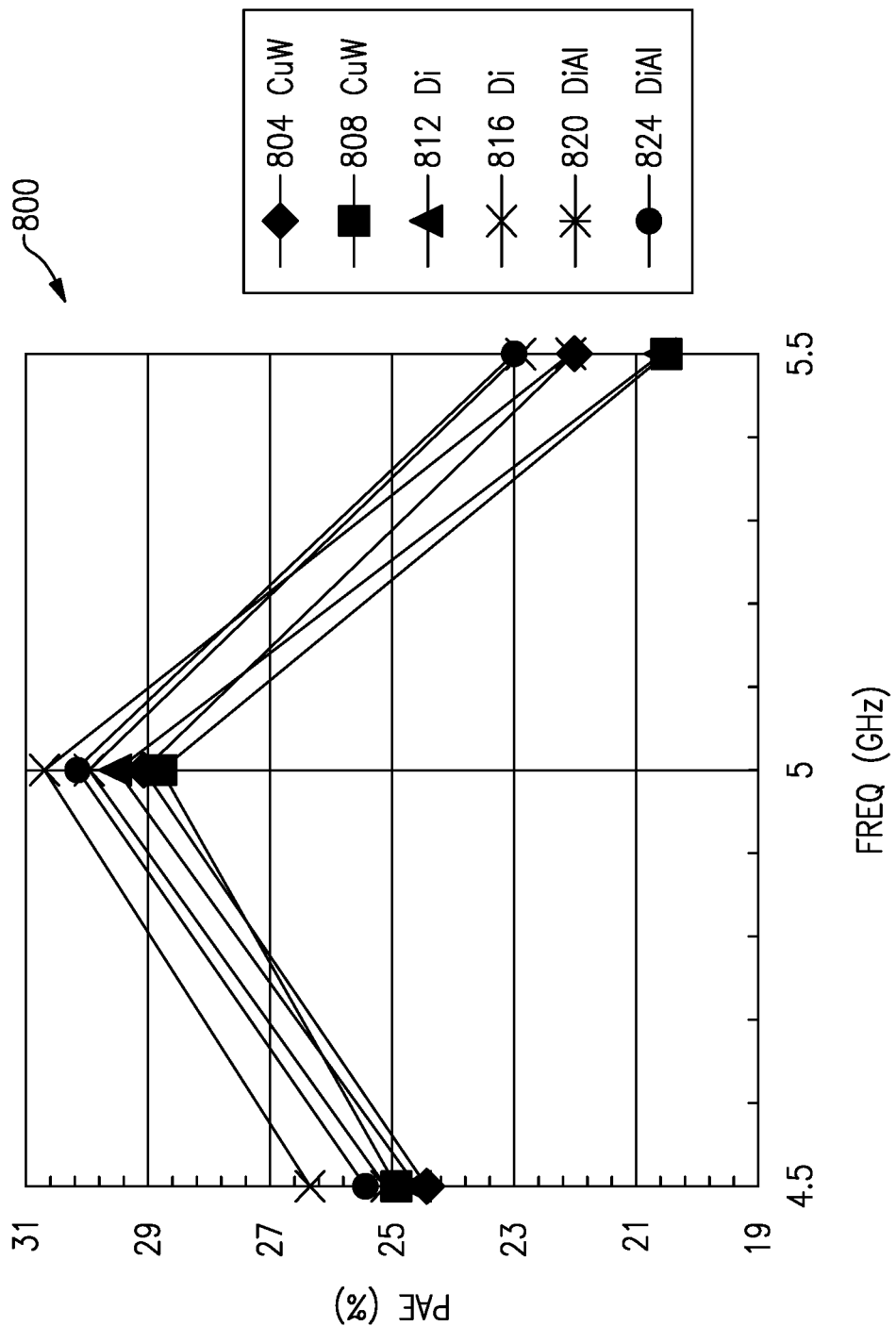
FIG. 8 shows a graph showing a comparison of power-added efficiency (PAE) versus frequency, obtained from device structures similar to the device structure of FIG. 6, in which the MMIC dies having an HEMT device are attached to different heat spreading substrates.

FIGS. 6-8 illustrate a device structure and comparative results illustrating thermal and electrical advantages of integrated IC devices including a diamond-based heat spreader, according to embodiments. FIG. 6 illustrates a device structure 600 in an MMIC die, which is used to obtain various comparative results described below. The device structure 600 includes a model of a 0.25 μm design rule HEMT device similar to that described above with respect to FIG. 3B. The HEMT device includes a stack a GaN layer 312, an AlN interlayer 316 and an AlGaN cap layer 320 formed on a 4H SiC substrate. The AlGaN layer 320 has formed thereon a source contact 324S, a gate contact 324G and a drain contact 324D. The GaN layer can be configured to form a 2 dimensional electron gas (2 DEG) therein, as described above. TABLE 1 and TABLE 2 illustrate comparative results of thermal profiles obtained under continuous wave (CW) operation from HEMT devices in MMIC dies attached to a CuW-based heat spreader and a diamond-based heat spreader according to embodiments.

TABLE 1

Simulations v. Measurements of Temperature During Operation: HEMT MMIC on CuW Heat Spreader
Temperature rise junction to base (CuW-based Heat Spreader)

|  | Sub-micron model (° C.) | | Experimental IR measurement (° C.) | |
|---|---|---|---|---|
| Channel Temperature | 192 | 140 | 189 | 138 |
| Base temperature | 85 | 25 | 84 | 27 |
| ΔT (C) Tj over base | 107 | 115 | 105 | 111 |
| Discrepancy Simulation vs Measurement | | Within 4° C. | | |

TABLE 2

Simulations v. Measurements of Temperature During Operation: HEMT MMIC on Diamond-Based Heat Spreader Having an Array of Vias
Temperature rise: Junction to Base (Diamond-based Heat Spreader)

|  | Sub-micron model (° C.) | | Experimental IR measurement (° C.) | |
|---|---|---|---|---|
| Channel Temperature | 102 | 165 | 103 | 167 |
| Base temperature | 25 | 88 | 27 | 84 |
| ΔT (C) Tj above base | 77 | 81 | 76 | 83 |
| Discrepancy: Simulation vs Measurement | | Within 4° C. | | |

TABLE 1 illustrates a comparison table of simulated versus experimentally measured channel temperatures, base temperatures, and temperature differences (ΔT) between the channel and the base, for the device structure 600 (FIG. 6) in an MMIC die including a 0.25 μm design rule HEMT device similar to that described above with respect to FIG. 3B, where the MMIC is attached to a CuW heat spreader. TABLE 2 illustrates a comparison table of simulated versus experimentally measured channel temperatures, base temperatures, and temperature differences (ΔT) between the channel and the base, for the device structure 600 (FIG. 6) in an MMIC die including a 0.25 μm design rule HEMT device similar to that described above with respect to FIG. 3B, where the MMIC is attached to a diamond-based heat spreader having an array of vias formed therethrough, according to embodiments. A comparison between the results in TABLE 1 and TABLE 2 shows that, by attaching the MMIC die to a heat spreader having an array of vias formed therethrough according to embodiments, the temperature differences (ΔT) between the channel and the base can be lowered by as much as 30° C.-35° C. According to various embodiments herein, a difference between a substrate base temperature and a channel temperature of the HEMT remains less than about 110° C., less than about 100° C., less than about 90° C., less than about 80° C., or a temperature in a range defined by any of these values.

FIG. 7 shows experimental temperature traces of the channel of an HEMT device under a pulsed (10 ms) power condition. The measurements correspond to those made on a device structure similar to the device structure 600 (FIG. 6) in which the MMIC dies having the HEMT device are attached to different heat spreaders. The temperature traces 704, 708 and 712 correspond to those taken from MMIC dies attached to heat spreaders formed of CuW, diamond-aluminum MMC, and diamond having an array of vias formed therethrough according to embodiments. The temperature trace 712 shows the lowest peak temperature, by as much as about 20 degrees relative to the temperature trace 704.

FIG. 8 shows a graph 800 showing a comparison of power-added efficiency (PAE) versus frequency, which is a figure of merit used in the industry for RF power amplifiers, measured on device structures similar to the device structure 600 (FIG. 6), in which the MMIC dies having the HEMT device are attached to different heat spreaders. The PAE, which accounts for the input power (Pin) to drive the amplifier, is the ratio of the RF power output (Pout) less input power (Pin) to total DC power (PDC) consumed, expressed as a percentage, expressed as: PAE=100 ($P_{out}$−$P_{in}$)/$P_{DC}$. The PAE curves 804, 808 correspond to MMIC dies attached to heat spreaders formed of CuW, the PAE curves 812, 816 correspond to MMIC dies attached to diamond-based heat spreaders having an array of vias formed therethrough according to embodiments, and the PAE curves 820, 824 correspond to MMIC dies attached to heat spreaders formed of diamond-aluminum MMC. The PAE curves show the highest efficiencies for MMIC dies attached to diamond-based heat spreaders having an array of vias formed therethrough according to embodiments, at least in part due to lower junction temperatures enabled thereby, as described above. This correlation is also shown in TABLE 3, which shows that various performance metrics, including gain improvement, output power improvement and PAE improvement observed by employing the heat spreader formed of diamond having an array of vias formed therethrough can be attributed at least in part to lower operational temperature.

TABLE 3

Performance Parameter Comparison Summary: HEMT MMIC on CuW, Diamond-Aluminum MMC and Diamond-Based Heat Spreader with an Array of Vias MMIC Performance Metric v. Temperature Improvement Heat Spreader

| Material | CuW | Diamond-Aluminum MMC | CVD Diamond Having Vias formed Therethrough |
|---|---|---|---|
| Cooling ΔT (C) over CuW | 0 | −23 | −35 |
| Gain Improvement (dB vs. CuW) | baseline | +0.23 | +0.35 |
| Output Power Improvement (dB vs. CuW) | baseline | +0.46 | +0.7 |
| PAE (% improvement vs CuW) | baseline | +1% | +2.2% |

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products. Aspects of this disclosure can be particularly implemented in various wireless telecommunication technologies in which high power, high frequency bands, improved linearity and/or improved efficiency are desired, including military and space applications such as radars, community antenna television (CATV), radar jammers and wireless telecommunication base-stations, to name a few.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A packaged integrated circuit (IC) device, comprising:
   a heat sink;
   a diamond-based heat spreading substrate on the heat sink, wherein the diamond-based heat spreading substrate has an array of hollow vias formed completely therethrough; and
   an integrated circuit (IC) die positioned on the diamond-based heat spreading substrate, wherein an edge of the IC die overlaps at least one of the vias.

2. The packaged IC device of claim 1, wherein the IC die is a monolithic microwave IC die configured to output a peak power density exceeding about 3 W/mm.

3. The packaged IC device of claim 1 wherein the IC die comprises a GaN-based high electron mobility transistor.

4. The packaged IC device of claim 1, wherein the diamond-based heat spreading substrate has an outer surface coated with an electrically conductive layer.

5. The packaged IC device of claim 4, wherein the outer surface of the diamond-based heat spreading substrate forms part of a radio frequency grounding path for the IC die that extends in a lateral direction substantially parallel to a major surface of the diamond-based heat spreading substrate.

6. The packaged IC device of claim 1, wherein the diamond-based heat spreading substrate is formed of polycrystalline diamond.

7. The packaged IC device of claim 1, wherein the diamond-based heat spreading substrate is formed of a metal matrix diamond composite material comprising diamond particles in a metal matrix.

8. A packaged integrated circuit (IC) device, comprising:
   a heat sink;
   a diamond-based heat spreading substrate on the heat sink, wherein the diamond-based heat spreading substrate has an array of vias formed completely therethrough; and
   an integrated circuit (IC) die positioned on the diamond-based heat spreading substrate, wherein an edge of the IC die overlaps at least one of the vias, wherein the array of vias includes an even number of vias, wherein half of the vias are positioned to overlap a first edge of the IC die and the other half of the vias are positioned to overlap a second edge of the IC die.

9. The packaged IC device of claim 1, wherein a combined volume of the vias is at least 3% of the volume of the diamond-based heat spreading substrate.

10. The packaged IC device of claim 8, wherein the vias are hollow.

11. A method of assembling an integrated circuit (IC) die, the method comprising:
    disposing a diamond-based heat spreading substrate on a heat sink, wherein the diamond-based heat spreading substrate has an array of hollow vias formed completely therethrough;
    positioning an IC die over the diamond-based heat spreading substrate such that at least one of the vias overlaps an edge of the IC die; and
    attaching the IC die to the diamond-based heat spreading substrate such that the at least one of the vias overlap the edge of the IC die.

12. The method of claim 11, wherein positioning the IC die comprises overlapping a first via of the vias with an edge of the IC die and overlapping a second via of the vias with a second edge of the IC die.

13. The method of claim 11, wherein positioning the IC die comprises positioning the first via and the second via symmetrically about a central axis extending in a direction substantially parallel to the edge and the second edge.

14. The method of claim 11, wherein the diamond-based heat spreading substrate comprises an outer surface that is coated with a conductive metal layer.

15. A packaged integrated circuit (IC) device, comprising:
    a diamond-based heat spreading substrate having an array of vias formed therethrough; and
    a monolithic microwave integrated circuit (MMIC) die on the diamond-based heat spreading substrate, the MMIC die configured to output a peak power density exceeding about 3 W/mm, wherein an edge of the MMIC die overlaps at least one of the vias, and wherein the diamond-based heat spreading substrate is configured to spread heat generated by the MMIC die away from the MMIC die.

16. The packaged IC device of claim 15, wherein the vias are hollow and the diamond-based heat spreading substrate has a conductive metal layer coating substantially an entire surface of the substrate including surfaces of the vias.

17. The packaged IC device of claim 16, wherein the MMIC die comprises a GaN-based high electron mobility transistor (HEMT) configured such that, when the peak power density dissipated exceeds about 3 W/mm, a difference between a substrate base temperature and a channel temperature of the GaN-based HEMT remains less than about 100° C.

18. The packaged IC device of claim 15, wherein the MMIC die includes a high power microwave device configured to dissipate a peak power density of at least 3 W/mm.

19. The packaged IC device of claim 15, wherein a first set of vias overlap a first edge of the IC die and a second set of corresponding vias overlap a second edge of the IC die laterally opposing the first edge, wherein each via in the first set and a corresponding vias in the second set have the same volume.

* * * * *